(12) United States Patent
Crawford et al.

(10) Patent No.: US 7,348,948 B2
(45) Date of Patent: Mar. 25, 2008

(54) POLYPHASE DIODE DRIVER

(75) Inventors: Ian D. Crawford, Longwood, FL (US); John Harwick, Sanford, FL (US); Miguel Morales, Winter Springs, FL (US)

(73) Assignee: Analog Modules, Inc, Longwood, FL (US)

( * ) Notice: Subject to any disclaimer, the term of this patent is extended or adjusted under 35 U.S.C. 154(b) by 676 days.

(21) Appl. No.: 10/889,308

(22) Filed: Jul. 12, 2004

(65) Prior Publication Data

US 2005/0276294 A1    Dec. 15, 2005

Related U.S. Application Data

(60) Provisional application No. 60/578,667, filed on Jun. 9, 2004.

(51) Int. Cl.
*G09G 3/32* (2006.01)

(52) U.S. Cl. .................................................... 345/82

(58) Field of Classification Search ................ 375/317, 375/342, 349, 360; 359/163, 189; 327/144, 327/113; 345/211, 39, 44, 46, 48, 53, 52, 345/69, 82

See application file for complete search history.

(56) References Cited

U.S. PATENT DOCUMENTS

| 5,287,372 | A | | 2/1994 | Ortiz | |
|---|---|---|---|---|---|
| 5,652,767 | A | * | 7/1997 | Kiyonaga et al. | 375/317 |
| 5,736,881 | A | * | 4/1998 | Ortiz | 327/175 |
| 5,936,599 | A | * | 8/1999 | Reymond | 345/82 |
| 6,466,188 | B1 | * | 10/2002 | Cato | 345/82 |
| 6,587,490 | B2 | | 7/2003 | Crawford | |
| 6,697,402 | B2 | | 2/2004 | Crawford | |
| 6,853,150 | B2 | * | 2/2005 | Clauberg et al. | 315/185 R |

* cited by examiner

*Primary Examiner*—Alexander Eisen
*Assistant Examiner*—Christopher E Leiby
(74) *Attorney, Agent, or Firm*—Gerald E. Linden; Derry A. Stauffer (57) ABSTRACT

A driver supplying a total current to a load has a plurality (n) of driver stages (ST1 ... STn). One stage is a master stage. Each driver stage has a switching device (Q) and an inductor (L) connected in series between the switching device and the output of the driver stage. The switching devices are turned ON in sequence with one another, during a cycle time (Tc) which is determined by sensing current through the inductor (L1) in the master stage. When the switching device is turned ON current through the inductor rises, when the inductor current reaches the value of a demanded current the switch is turned OFF, and after the switch is turned OFF the inductor continues to supply (output) current to the load with a current which ramps down. A rectifying device (D) connected between the inductor and the supply line allows current to continue to flow in the inductor and be supplied to the load after the switch is turned OFF.

35 Claims, 5 Drawing Sheets

Digital Timing Diagram (typical)

US 7,348,948 B2

POLYPHASE DIODE DRIVER

CROSS-REFERENCE TO RELATED APPLICATIONS

Priority is claimed from U.S. Provisional Patent Application No. 60/578,667 filed Jun. 9, 2004 by Crawford et al.

TECHNICAL FIELD OF THE INVENTION

This invention relates to diode drivers that provide a constant, controlled, pulsed, or variable current into a light emitting diode (LED) or array of light-emitting diodes, including laser diodes.

BACKGROUND OF THE INVENTION

Figure 1:
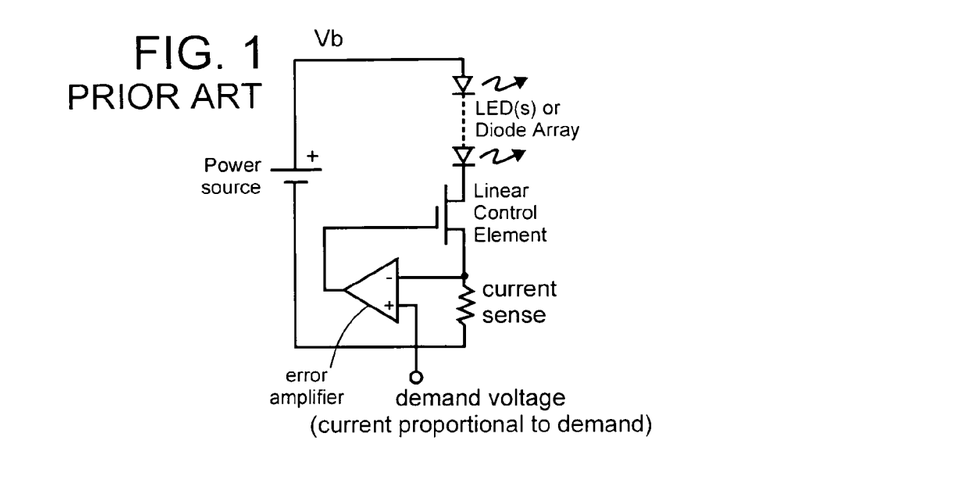
FIG. 1 is a schematic diagram of a prior-art diode driver.

Analog constant current sources or pulsed analog constant current sources using linear dissipative pass elements have been used as diode drivers to power light emitting diodes, often laser diodes. FIG. 1 illustrates an array of LEDs (or diode array) that are connected to a power source. A linear control (pass) element is disposed in the return path from the LED array to the power source. Current flowing through the LEDs flows through a current sense resistor which supplies a voltage indicative of current to an input of an error amplifier, the other input of which receives a reference demand voltage indicative of the desires current. The output of the amplifier controls the linear control element to maintain a constant current through the LEDs. This is a simple, straightforward analog control loop. Such analog current sources are inefficient due to power (e.g., heat) dissipation in the linear pass element controlling the current.

U.S. Pat. No. 5,287,372 ("Ortiz") discloses a quasi-resonant diode drive current source that provides high power pulsed current that drives light emitting diodes, and the like. The pulsed output current of the quasi-resonant diode drive current source is sensed, and is regulated by a control loop to a level required by the light emitting diodes. The implementation is heavy and not suited to smaller surface-mount technology because the power components are large to filter the single-phase switching waveform from the switch transistor (24). Normally, in either case (i.e., either of FIG. 1 or "Ortiz") the switch (or pass) transistor would require a heat sink.

For pulsed laser or LED sources, the energy is typically stored in a capacitor to minimize a sudden lossy power demand from the prime power source. With a linear current regulator, the regulator pass element must remain in the linear region during the discharge of the energy storage capacitor to regulate the pulse of current. To minimize the voltage initially across this pass element, and hence dissipation, the capacitor must have a small value of voltage droop during this current draw, requiring a large amount of stored energy and a large capacitance value. The quasi-resonant controller shown by Ortiz is required to pass this peak current and power demand through to its power source (22), causing a large transient current draw, and is limited in rise and fall times which can be achieved due to the frequency and power limitation of a single stage and the time required to charge up the output filter capacitor (C1).

BRIEF DESCRIPTION (SUMMARY) OF THE INVENTION

It is therefore a general object of the invention to supply a continuous or pulsed constant current to a light emitting diode or diodes (LED) load with miniature size, low-cost construction, high efficiency, and superior performance, using a circuit capable of implementation with modern miniature surface mount components. As used herein, an "LED" load includes a laser diode or array of laser diodes. As used herein, "constant current" means essentially constant current, regardless of the actual voltage across the LED load, which can vary.

According to the invention, generally, the linear pass element of the current source in FIG. 1 is replaced by a multitude (plurality, n) of staggered-phase switching elements so as to create a controlled current with low ripple and fast rise and fall times if demanded. Because the switching elements are either ON or OFF, there is no dissipation due to a lossy linear control element such as the pass element illustrated in FIG. 1. By using multiple stages, each controlling a portion of the total current (i.e., for a portion of the time during a cycle), the dissipation due to inductor, switching and saturated resistance losses is shared and distributed amongst many parts allowing the use of small cheap surface mount devices. In comparison, Ortiz uses individual large devices with relatively high local dissipation. By staggering and controlling the switching waveform phase of the multiple switching elements, ripple may be greatly reduced even with small inductor values. The polyphase driver of the present invention substantially overcomes the problems associated with the background art discussed hereinabove.

According to the invention, a driver supplying a total current to a load comprises a plurality (n) of driver stages (ST). One stage is a master stage. Each driver stage has a switching device (Q) and an inductor (L) connected in series between the switching device and the output of the driver stage. The switching devices are turned ON in sequence with one another, during a cycle time (Tc) that is determined by sensing current through the inductor (L1) in the master stage. When the switching device is turned ON current through the inductor rises, when the inductor current reaches the value of a demanded current the switch is turned OFF, and after the switch is turned OFF the inductor continues to supply (output) current to the load with a current which ramps down. A rectifying device (D) connected between the inductor and the supply line allows current to continue to flow in the inductor and be supplied to the load after the switch is turned off.

The switching device in the master stage is turned ON at the beginning of the master cycle time, and the switching devices in the stages other than the master stage are turned ON periodically during the master cycle time.

The switching device in the master stage is turned OFF when current through the inductor in the master stage reaches the value of a demanded current, and the switching devices in the stages other than the master stage are turned OFF either:

after a time which corresponds to the time (Tp) it took for the value of the demanded current to be reached in the master stage, or when the value of the demanded current is reached in the given stage other than the master stage.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Conventional electronic components may be labeled with conventional schematic-style references comprising a letter (e.g., A, C, Q, R) indicating the type of electronic component (e.g., amplifier, capacitor, transistor, resistor, respectively) followed by a number indicating the iteration of that element (e.g., "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown.

The structure, operation, and advantages of the present preferred embodiment of the invention will become further apparent upon consideration of the following description taken in conjunction with the accompanying drawings.

DETAILED DESCRIPTION OF THE INVENTION

Figure 2:
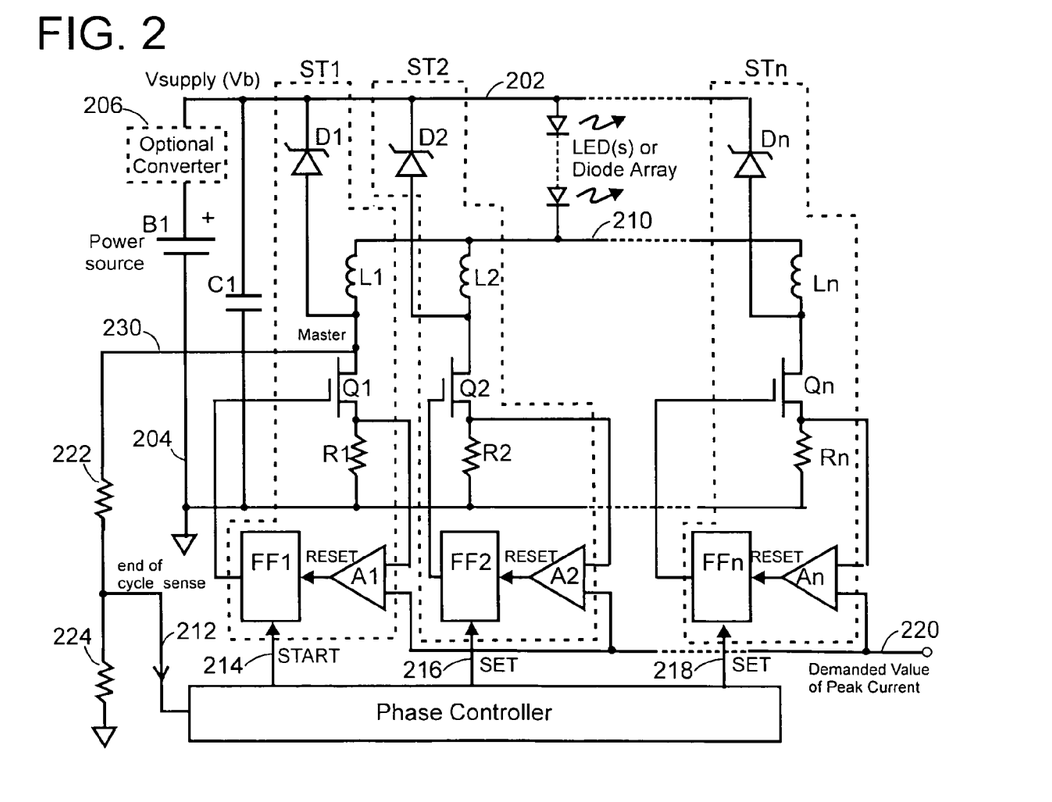
FIG. 2 is a schematic diagram of a polyphase diode driver according to the invention.

FIG. 2 illustrates schematically an embodiment of the polyphase diode driver of the present invention having a number "n" of stages for driving a load that may be an LED, a plurality of LEDs, or a diode array, such as laser diodes. When the load is referred to hereinafter as an "LED", it should be understood that any of these loads are being referred to. There are at least two driver stages.

In this example of the polyphase diode driver, three driver stages—ST1, ST2 and STn—are illustrated, and are described in greater detail hereinbelow.

A power source B1 is connected between a supply line 202 (Vsupply) and a return line (ground) 204. A storage capacitor C1 is connected between the supply line 202 and ground 204. An LED load has one end connected to the supply line 202 and another end connected to a common LED drive terminal (common cathode in FIG. 2) 210 that is the common outputs of the plurality of driver stages ST1, ST2 and STn. (The outputs of the driver stages are all connected to the LED drive terminal 210.)

A converter 206 (shown in dashed lines) is optionally connected in series with the power source B1, between the power source B1 and the supply line 202. The converter 206 may be used if the LED load voltage needed for current flow is higher than can be supplied by the battery B1, or to facilitate storage of energy in C1 for a current pulse.

The capacitor C1 provides decoupling/return for high frequencies to ground, and for pulsed applications stores energy so the battery B1 can be small (provides average power to charge the capacitor, not peak power to the LED load).

A Phase Controller has an input 212 (end of cycle sense) and n (in this example, n=3) outputs 214, 216, 218, and is described in greater detail hereinbelow.

An input line 220 is shown. A signal representative of demanded value of peak current is impressed on the input line 220, as described hereinbelow.

A voltage divider comprising two series-connected isolating resistors 222 and 224 is shown. One end of the resistor 224 is connected to ground 204. The other end of the resistor 224 is connected to one end of the resistor 222. The other end of the resistor 222 is connected to a master stage current sense line 230. The input 212 of the phase controller is connected to the junction of the two resistors 222 and 224. As will become evident, the voltage divider, connected as it is to the output of the switching device Q1 (described hereinbelow) provides means for sensing the end of a cycle of the first driver stage ST1. This could be implemented in other ways such as AC coupling the transient via a capacitor, as long as a large steady DC current is blocked.

Each driver stage ST1, ST2 ... STn comprises:

- a switching device (preferably a FET) Q1, Q2 ... Qn having a "switching terminal" and two "end terminals" (in the case of an FET, the switching terminal is the gate, and the two end terminals are the source and drain);
- an inductor L1, L2 ... Ln having two ends, for storing energy;
- a diode D1, D2 ... Dn having two end terminals;
- a resistor R1, R2 ... Rn having two ends;
- a flip-flop FF1, FF2 ... FFn having a set input, a reset input and an output; and
- a fast comparator A1, A2 ... An having two inputs and an output.

The diodes (D) allow current to continue to flow from the stored energy in the inductors (through the respective diodes) when the respective switching devices (Q) turn OFF. The diodes (D) could be replaced with a synchronously controlled switching element (typically a FET) that turns ON when the main switch Q1 etc. turns OFF, and visa versa. This is more complex, but is known by those skilled in the art to produce lower loss in some cases. (Generically speaking, the diodes (D) and synchronously controlled switching element both function as "rectifying devices" to prevent current from flowing from the supply line 202 through switches (e.g. Q1) when Q is turned ON.)

For each driver stage (e.g., ST1), the output of the flip-flop (e.g., FF1) is connected to the switching terminal (for an FET, the gate) of the switching device (e.g., Q1). The drain terminal of the switching device (e.g., Q1) is connected to an end of the inductor (e.g., L1). The diode (e.g., D1) is connected between the supply line 202 and the drain terminal of the switching device (e.g., Q1) (i.e., to the junction of the switching device (e.g., Q1) and the inductor (e.g., L1)). The other end of the inductor (e.g., L1) is connected to the common drive terminal 210. The source terminal of the switching device (e.g., Q1) is connected via a resistor (e.g., R1) to ground 204. The source terminal of the switching device (e.g., Q1) is also connected to an input of the comparator (e.g., A1). The other input of the comparator (e.g., A1) is connected to the demand line 220. The output of the comparator (e.g., A1) is connected to the reset input of the flip-flop (e.g., FF1).

The first output 214 of the phase controller is connected to the set (start) input of the flip-flop FF1 of the first stage ST1, to turn on the flip-flop FF1. The second output 216 of the phase controller is connected to the set input of the flip-flop FF2 of the second stage ST1, to turn on the flip-flop FF2. The n-th output 218 of the phase controller is connected to the set input of flip-flop FFn of the n-th stage ST1, to turn on the flip-flop FFn. (The flip-flop FFn is reset by the comparator An.)

At least one of the driver stages (the master) has a current sensing component such as the resistor R1 (shown) or transformer (not shown) to determine the peak current flowing through the inductor (L1). The simplest approach is to use a single master stage (in this example, ST1) sensing its peak current with the other stages functioning as slaves driven from a delay with the same peak current by similarity and the same on time. The cycle is repeated when the current through the master inductor (e.g., L1) falls to zero or another predetermined level, and the delay times are set to 1/n of a complete master cycle.

To allow more flexibility with different input and load voltages and better response to a demand change, a slightly more complex approach is preferred. Because of the high cost of certain types of light-emitting diodes, and to avoid the possibility of an excessive current in a switching stage (i.e., driver stage) due to a malfunction (and consequent damage/destruction of the LED), it is also preferred that the current is directly sensed in every switching stage (ST1, ST2 . . . STn). Thus, there is shown a sense resistor R1, R2 . . . Rn in series with the respective switching device Q1, Q2 . . . Qn, and fast comparators A1, A2 . . . An compare the current in each stage with the demanded value on line 220. (The demanded value for peak current is preferably the same for all of the stages.) The outputs of the comparators A1, A2 . . . An reset a flip-flop FF1, FF2 . . . FFn to turn OFF each switch when the demanded peak current is reached. The delay generator (Phase Controller) described in the control section below sets the flip-flops FF1, FF2 . . . FFn to turn ON each stage sequentially. The currents in each inductor L1, L2 . . . Ln sum into the LED load to give essentially a DC current flow.

If only one of the stages (i.e., the master stage) has current sensing (i.e., R1, A1, FF1), for the remaining stages having no current sensing (i.e., no current sensing resistor R, no comparator A, no flip-flop FF, no connection to the demanded current line 220), the gate terminal of the switching device (Q2 . . . Qn) would be connected directly to the output of the phase controller and the source terminal would be connected to ground.

The LED current can be sensed on a terminal of the LED (directly), or it can be indirectly sensed by adding up the currents in R1 . . . Rn and inferring a fixed ratio between the current peak and the average DC current (which will be 0.5 times n times peak current if the next cycle starts immediately after one finishes, due to geometry of two triangles, ramp up and ramp down.). If this duty cycle changes due to a delay after a cycle, then the indirectly sensed current would be the sum of all the ramps up, and the ramp down through D1/ . . . Dn, i.e. all the composite currents summing and flowing in the LED.

If one were to leave out (omit) the sense resistors R2 and R3 in the slave stages (ST2 . . . STn), the corresponding comparators (A2 . . . An) and flip-flops (FF2 . . . FFn) would also be omitted. However, in such a case, the phase controller would have to be capable of turning OFF Q2 . . . Qn at the right time when the peak current is reached (i.e., same time as the master Q1 took), but delayed in phase.

The polyphase diode driver of FIG. 2 is suitable for providing a constant, controlled, pulsed, or variable current into a light emitting diode (LED) or array of light-emitting diodes, including laser diodes. The frequency of switching is high compared to the pulse width. A pulse is formed by the sum of a burst of switching as demanded by the waveform on line 220.

For pulsed diode drivers, the desired output current is frequently high, for example 100 amps, and this current is frequently unable to be provided by the power source B1 directly, for example, if a small battery with high internal resistance is used, or if the LED load voltage is greater than the available battery/power source B1 voltage. In such a case, it is preferred to store the energy in a capacitor C1 and add a switching converter (206) between the battery/power source B1 and capacitor C1, as described hereinabove, so that the current drawn from the power source B1 is the much lower average value needed to recharge and maintain sufficient voltage on the capacitor C1. (In theory C1 would not be needed if the battery B1 were of sufficient voltage and a low source impedance at all frequencies, but in practice C1 is used to reduce EMI, smooth the input line 202 at high frequencies, and return the residual ripple currents to ground.)

The period of the polyphase diode driver Q1 . . . Qn gate turn-on signals (discussed hereinbelow) can be changed to maintain a constant current in the LED as the storage capacitor C1 discharges. (Increased switch ON time as the C1 voltage falls to maintain the same peak current in the inductors). This allows the possibility of a relatively large C1 voltage discharge down to a level just above the required LED voltage. The capacitor C1 also more efficiently stores energy at high voltage ($E=0.5$ ($C \times V$ Squared)), and for both these reasons can be smaller in size and value than a capacitor used, for example, in the linear driver of FIG. 1 This flexible input voltage and storage capability is not shown in Ortiz. The energy required to be stored in the capacitor C1 is about one order of magnitude less than would be required with a linear driver.

Control Circuit (Phase Controller)

The control circuit (phase controller) fulfils two requirements—control of the total current flow in the LED, and timing of the polyphase switch turn-on pulses (e.g., 214, 216, 218) to minimize ripple. It is desirable to have a control circuit that handles variations in input voltage and LED voltage automatically, thus minimizing ripple.

The simplest current control method scales and sets the reference (220) for the comparators A1, A2 . . . An. If the next cycle starts as soon as the inductor current decays to zero, the average current in one stage is 50% of the peak current due to the triangular shape of both the rise and fall of current. The LED current is then proportional to the reference value in the ratio of 0.5 times (demanded volts/R1) times n, where n is the number of stages. This allows simple control of the total current by adjusting the demanded voltage (220).

Figure 3:
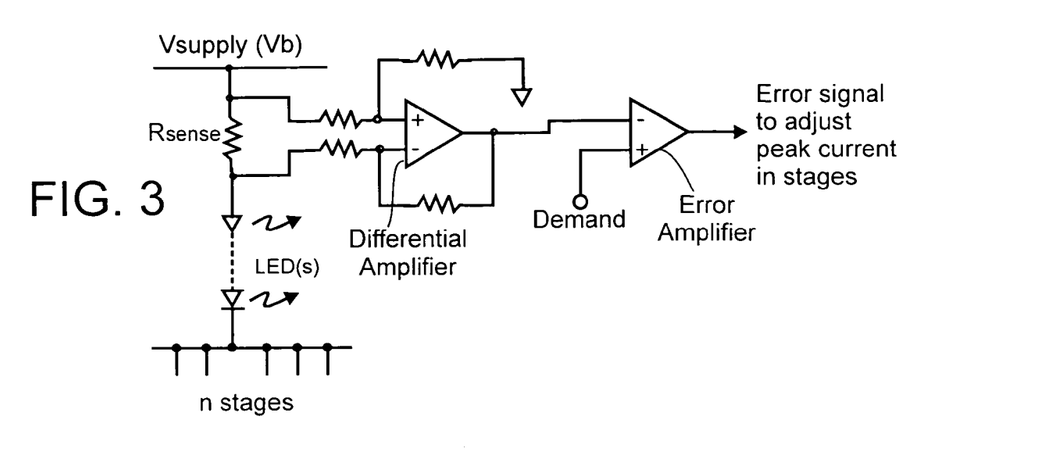
FIG. 3 is a schematic diagram of a control circuit, according to the invention.

With reference to FIG. 3, in an optional more complex scheme where greater accuracy or dynamic range is required, the total LED current may be measured by, for example, a low value resistor Rsense (shown), current sense transformer (not shown) for pulsed operation, or a Hall effect sensor (not shown). An input current-demand signal (Demand) is compared to the current in the LED with an error amplifier and the error signal is used to control the ON time of the switches or peak current demand until the LED current is equal to the demanded current. A differential amplifier or other equivalent means accomplishes level shifting if needed. (The error signal from FIG. 3 would set the demanded voltage on the line 220 in FIG. 2.) As voltage increases across Rsense, the output of differential amplifier increases. When the Demand is exceeded, the error amplifier reduces the value at 220 (FIG. 2) to turn down peak currents. The error amplifier may be appropriately compensated to give a stable suitably damped response to changes in demand.

How it Works

The current driver has a plurality (n) of at least two stages. Each stage has a switch (Q) and an inductor (L) in series with the switch. The inductors (L1 . . . Ln) of all the stages (ST1 . . . STn) are connected to a load such as LEDs or laser diodes. The load (LEDs) is also connected to a supply line (Vb). A phase controller controls the turning ON and turning OFF of the switches (Q1 . . . Qn) in all of the stages (ST1 . . . STn).

Figure 4:
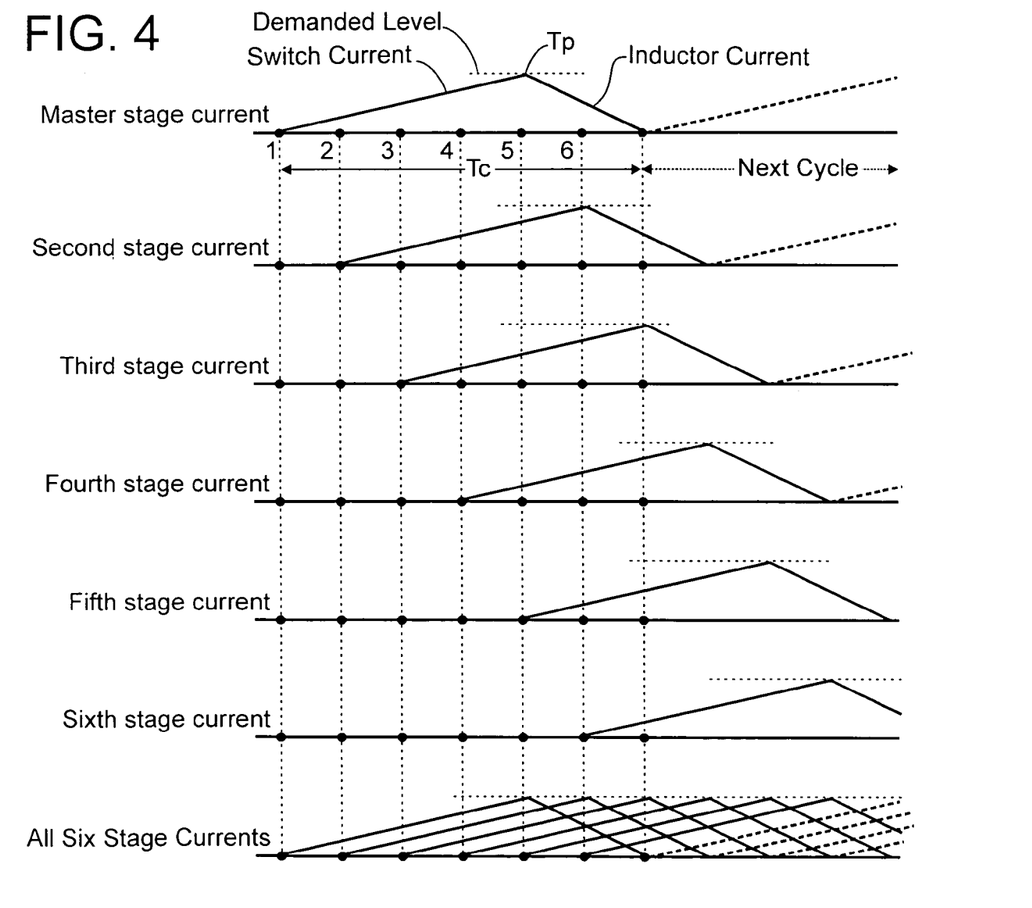
FIG. 4 is a timing diagram illustrating how a number (n) of stages (in this example, n=6) may be switched, according to the invention.

FIG. 4 is a timing diagram illustrating how a number (n) of stages (in this example, n=6) may be switched, according to the invention. Seven waveforms are shown. The top one is for current through the switch (Q1) and inductor (L1) of the first/master stage (ST1). The next five waveforms are for current through each of the switches of five subsequent stages (ST2 . . . ST6). The bottom waveform is for total current delivered to the load (e.g., LEDs).

The first, master stage (ST1) is turned ON. The current through the inductor, hence the current that is output from the master stage to the load, ramps up (rises), and when the inductor current reaches a demanded value (220) the switch is shut off. (This occurs at time Tp). After the switch is turned OFF, the inductor continues to supply (output) current to the load with current that ramps down. A diode (D) or synchronous switch is connected between the inductor and the supply line to allow current to continue to flow in the inductor and be supplied to the load after the switch is turned off. When the current being supplied from the inductor (L) reaches (ramps down to) a low threshold such as zero ("end of cycle sense"), this is defined to be one cycle time (Tc). Control over the switch (Q) is effected with a comparator (A) and a flip flop (FF), and (in at least the master stage) a current-sensing resistor (R).

At the end of the cycle, the switch in the master stage is turned back on, and the process of current ramping up, turning off the switch when peak current is sensed (at Tp), and current ramping down is repeated (as long as there is a non-zero demanded value (220)).

In the phase controller, the cycle time (Tc) is divided, by the number of stages (n), and the switches (Q2 . . . Qn) of the subsequent stages (ST2 . . . STn) are turned ON (triggered), sequentially, at intervals of Tc/n. (The cycle time, Tc, divided by the number of stages, n, gives a phase delay period, Td. The subsequent stages are turned on periodically during the "master" cycle time Tc.) The switch in each stage may be turned off (open loop) after a time that corresponds to the time (Tp) it took for the demanded level of current to be reached in the master stage. Alternatively, the subsequent stages also have their own current sensing (R2 . . . Rn, A2 . . . An, FF2 . . . FFn), and their respective switches (Q2 . . . Qn) are turned off (closed loop) when the demanded level of current is reached in the subsequent stage (ST2 . . . STn). It is within the scope of the invention that the switches (Q2 . . . Qn) of the subsequent stages (ST2 . . . STn) can be turned OFF later, thereby allowing their outputs to run into the next cycle in a controlled phase.

Regarding individually sensing current in each stage and turning OFF the switches (Q2 . . . Qn) of the subsequent stages (ST2 . . . STn) when the demanded level of current (220) is reached, it should be understood that it is possible that the value for current demand (220) would change within the cycle time (Tc). (This can happen, for example, if the current demand is varying (e.g., modulated).) In such a case, the subsequent stages (ST2 . . . STn) could have a different value of reference as the current tries to adjust. Nevertheless, such cases are intended to be embraced by language such as "the switching devices in the stages other than the master stage are turned OFF when the demanded level of current is reached in the given stage other than the master stage." It is also within the scope of the invention that the line 220 could be "split", and different values of demand/timing could be used for different stages.

In this manner, current is supplied to the load from all of the stages (ST1 . . . STn). These output currents from all of the stages are summed on the common drive terminal 210. Since the current waveforms for each stage are triangular, when they add up the total current supplied to the LEDs will be n/2 times the peak current in any given stage (one half n because the area of a triangle is bh/2). Therefore, two things become evident:

1. The demanded current (220), which is the peak current for the individual stages, needs to be scaled in proportion to the number of stages. The total current equals n/2 (one half "n") times the demanded current (220).
2. Everything else being equal, adding more stages (increasing "n") results in more total current being delivered to the load. Conversely, for a given desired total current, increasing the number of stages reduces the size of the individual components (namely inductors).

It is within the scope of the invention that the total current is either "approximately" n/2 the demanded current, or another fixed ratio (multiple) of the demanded current, depending for example on the timing of the ON and OFF pulses to the switching devices of the stages.

It should be appreciated that the cycle time (Tc) for the master stage (as well as the cycle times for the subsequent stages) is typically on the order of hundreds (e.g., 250) kilohertz (e.g., 4 microseconds). Therefore for a 250 kHz basic switched element, the effective ripple frequency of all 6 stages would be 6×250 kHz=1.5 mHz. Adding stages (increasing "n") decreases ripple. Generally, the number of stages will depend on the amount of ripple that can be tolerated, the current needed, and the current ratings of available cheap parts. For 150 amps total current and a few percent ripple, 6-8 stages is an appropriate number of stages.

By maintaining the value for the peak demanded current signal 220 constant, a constant total current will be supplied to the load. By changing the peak demanded current signal 220 the total current will change, according to any desired profile, including modulated and pulsed. Typically, the peak demanded value will be changed at a much lower frequency (e.g., seconds or tenths of seconds, or hundredths of seconds, or milliseconds) than the switching frequency (e.g., 250 kHz) to represent an outline of the desired current profile. The average current in the LED load changes to reflect the demand from OFF to maximum.

As mentioned above, low ripple is accomplished by spacing the start of each of the phases equally throughout the time (duration) of a single-phase complete cycle. The ramp up of a switch current ON time depends on the power source voltage minus the LED voltage, and the inductor value.

($i/t=(Vb-V1)/L$, where i is the current, t is the time the voltage has been applied, Vb is the effective power supply voltage, and V1 is the LED voltage). After the peak current is reached, the inductor current ramp-down time depends on the LED voltage. To reduce the turn-on switching losses it is desirable to allow the current to reach zero before commencing the next cycle. Therefore, the cycle time (Tc) will change as the capacitor C1 voltage decays (the cycle lengthens, or reduces frequency). One phase (the first) may be designated as the "master" and the time for its current to ramp up and down sets the cycle time or frequency of operation. The second and subsequent ("slave") phases are delayed from the master phase to give minimum ripple. This cycle is repeated as the master repeats its turn ON current ramp.

FIGS. 3 and 4 presume that each of the stages is identical—particularly, having the same inductors. While this is preferred, it is not absolutely necessary. However, it will be understood that by making all the stages the same, parts can be standardized. If they are not identical, the ripple will be greater in magnitude and the control circuit would be more complex also.

Control Circuit (Phase Controller)

The control circuit (phase controller) may be analog or digital. In either case, the desired phase delay time is equal to the sum of (the current ramp up time of a single stage to the desired peak current, divided by n), plus, (the inductor current decay time into the LED load voltage, divided by n), where n is the number of stages.

From a geometric viewpoint, if the rise and fall ramps are straight lines, the total current is n times half the peak current, since a new cycle starts immediately. This makes some assumptions, but the FIG. 3 embodiment closes the loop and is therefore more accurate, but more complex. The FIG. 5A and FIG. 6A embodiments, discussed hereinbelow, are simply different ways to get the same timing and waveforms that are shown in FIG. 4.

Analog Implementations of the Control Circuit (Phase Controller)

Two examples of an analog implementation are described.

Figure 5A:
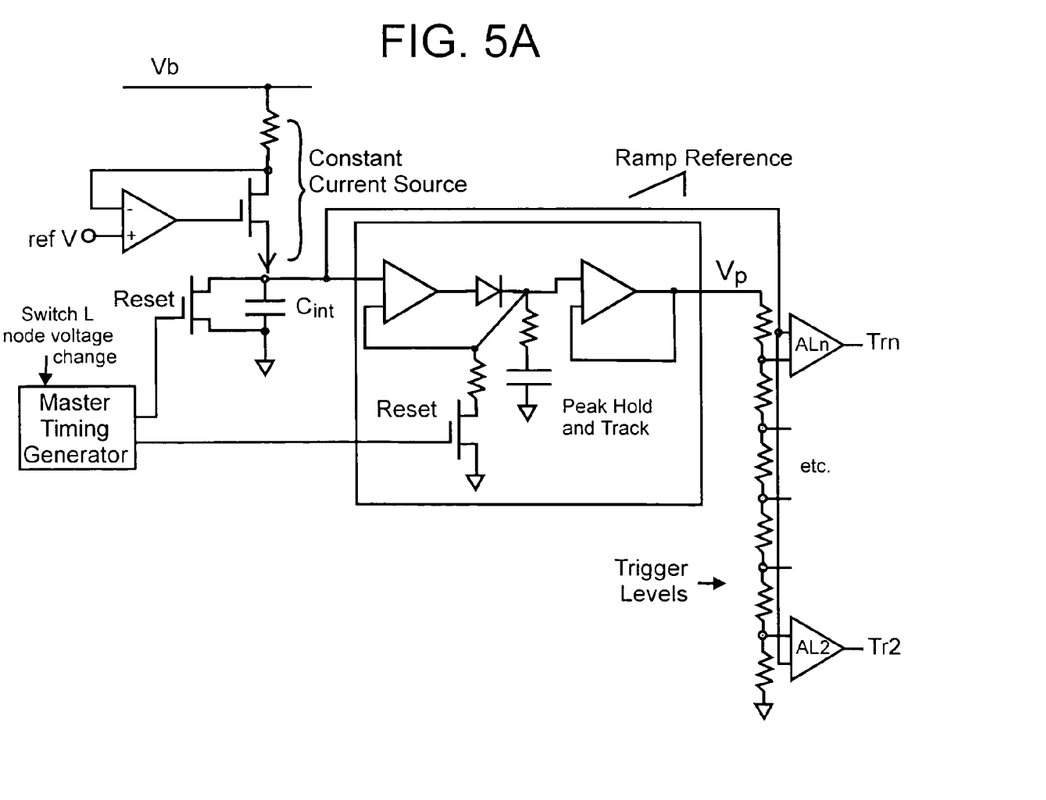
FIGS. 5A and 5B are timing diagram and schematic respectively, for a first analog implementation of a control circuit for the polyphase diode driver, according to the invention.
Figure 5B:
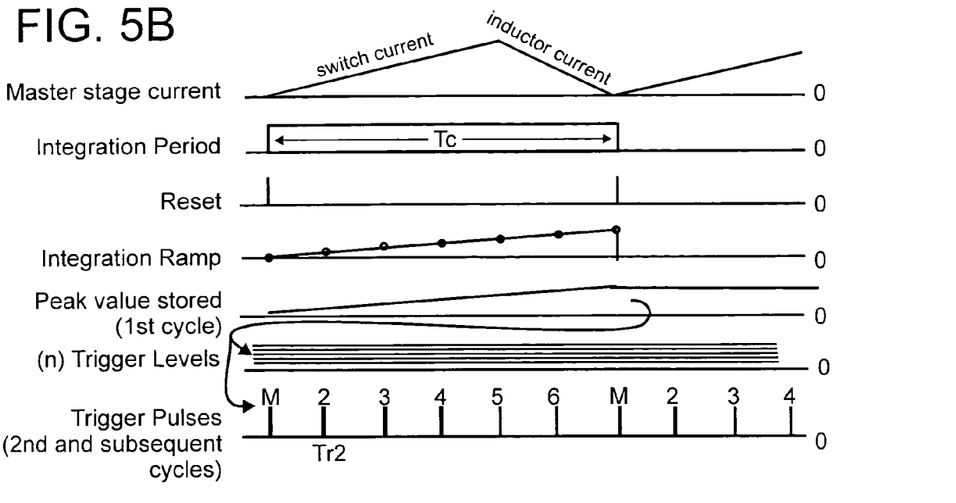

FIGS. 5A and 5B are schematic and timing diagram, respectively, for a first analog implementation of the control circuit, according to the invention. This analog approach measures the time of a first master cycle (represented by a voltage level) by measuring the peak voltage value of a linear ramp which ramps up during the master cycle time. This ramp peak value at the end of the master cycle is held and divided into n equally spaced levels. During the next cycle of the master, a new phase is started as the linear ramp reaches each of these threshold levels, thus spacing out the n cycles equally throughout the master cycle time. This arrangement is described in more detail below.

During the master switch (or stage, e.g., ST1) cycle period time Tc, an integrating capacitor Cint is charged from a constant current source to a value Vp (peak value stored from the 1st cycle) representing this time (Q1 gate ON time, or L1 charging time). This peak ramp value Vp is sampled and held at its peak value Vp just prior to a reset to zero at the start of the next cycle of the master and integrating capacitor Cint. The master cycle is stopped and restarted by sensing the change in voltage at the switch/inductor node (e.g., connection of the switch Q1 and inductor L1) of the master stage that occurs at zero current in the inductor. (See FIG. 2, end of cycle sense 212 input to phase controller.) The held value (Vp) is divided into (n−1) levels (Trigger Levels) using a resistor divider comprising n series-connected resistors (right hand side of figure). These levels are used as references for (n−1) fast comparators AL1 to ALn, each one with an output (Tr2 to Trn) setting a respective flip-flop (e.g., FF2 . . . FFn of FIG. 2) to turn ON its respective switch (e.g., Q2 . . . Qn of FIG. 2). For example, the comparator (AL2) turning ON the second switch (Q2) would use as a reference the second level (the first above ground); the comparator (ALn) turning on the nth switch (Qn) would use the nth level as a reference. (The resistor divider provides "evenly-spaced" voltage levels so that the trigger pulses Tr2 to Trn will be equally spaced in time.) The integration ramp signal is connected to the non-referenced inputs of the comparators AL2 to ALn so that when their respective reference level is reached, the flip-flops (e.g., FF2 . . . FFn of FIG. 2) turning ON the respective switches switch (e.g., Q2 . . . Qn of FIG. 2) are triggered in turn (sequence).

Since the ramp signal is linear due to the constant current source and fixed integrating capacitor Cint value, each switched stage (e.g., ST2 . . . STn of FIG. 2) is sequentially turned on at a spacing time of 1/n of the master cycle time of the prior cycle. As the master cycle time changes, the stored reference changes based on the stored value Vp and the divided value changes to maintain equal spacing of the start of each phase. The switches (e.g., Q2 . . . Qn of FIG. 2) are held on with a flip-flop (e.g., FF2 . . . FFn of FIG. 2) and turned OFF (reset) when the peak current limit is reached as sensed by the fast comparators (AL1 to ALn). It should be noted that, in this implementation, there is one cycle of "latency" as the stored voltage value (Vp) representing the time of the master cycle is that of the prior cycle. The master stage operates independently and sets the timing for the next cycle of n−1 phases.

Figure 6A:
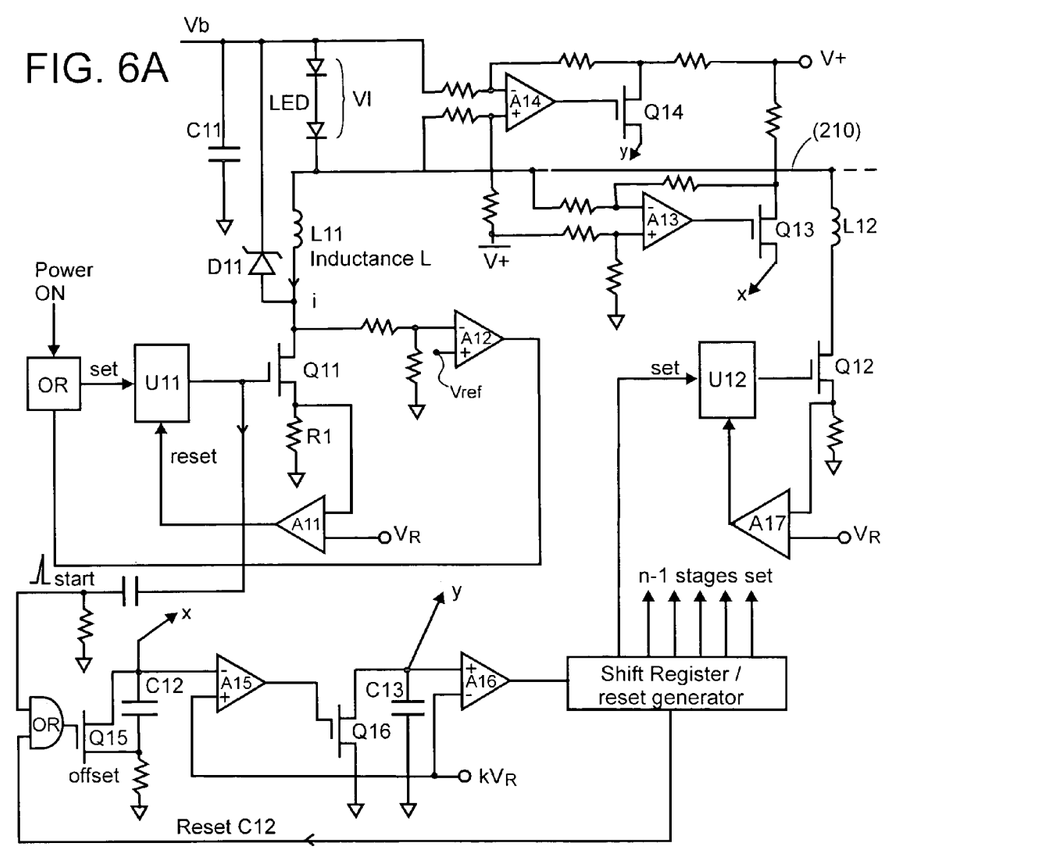
FIGS. 6A and 6B are schematic and timing diagram, respectively, for a second analog implementation of the control circuit for the polyphase diode driver, according to the invention.
Figure 6B:
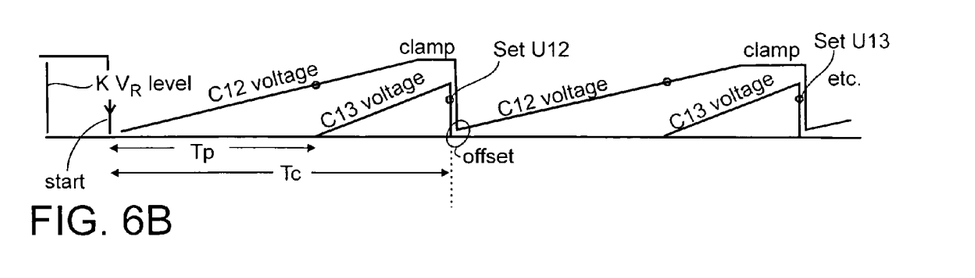

FIGS. 6A and 6B are schematic and timing diagram, respectively, for a second analog implementation of the control circuit, according to the invention. This implementation does not suffer from the aforementioned one cycle latency of the previously described implementation.

The implementation shown in FIGS. 6A and 6B automatically adjusts the phase delay time continuously for input voltage Vb, LED voltage V1, and demanded current reference Vr. A capacitor C11 (compare C1, FIG. 2) is shown connected between input voltage Vb and ground. A plurality of "n" switching/driver stages (compare ST1, ST2 . . . STn; FIG. 2) may be controlled.

A master switching stage flip-flop U11 is set by power on initialization to turn ON switch Q11 and ramp current into its respective inductor L11. When the demanded peak current is reached, fast comparator A11 outputs a pulse to reset the flip-flop U11 and turn OFF the master switch Q11. The inductor L11 current continues to flow in the LED load and the diode D11, ramping down as the stored energy is depleted. When the current reaches zero, a fast comparator A12 senses the change in the inductor voltage as, D11 stops conducting and sets the flip-flop U11 to begin the next master cycle.

The master stage determines the frequency of operation, and it remains to set a phase delay for each of remaining (n−1) phases to ensure equal spacing throughout the master cycle time. The delay for each phase is the sum of (1/n times the master switch current ramp up time, plus 1/n times the ramp down time of the energy stored in the inductor L11). The ramp up time is L times $i/(Vb-V1)$ and the ramp down time is L times $i/V1$. This circuit creates an analog of this function. The values of L and n are constants and are set in the circuit by the value of capacitors and resistors chosen. "i" is the inductor current. Vb is the supply voltage and V1 is the voltage drop across the LED load. Differential amplifier/current source A13 and P FET Q13 generate a current proportional to (Vb−V1) to charge capacitor C12. (Note the connection labeled "x" from Q13 to C12.) The differentiated leading edge of the master switching device Q11 turn-ON signal initiates operation by quickly resetting and releasing capacitor C12 with N FET Q15. The current at x charges capacitor C12 to a level representing i or K times Vr (KVr), where K is a constant and Vr is the reference voltage controlling the peak current for each stage. K is selected so that the time to reach this value KVr represents 1/n of the current ramp up time. For example, if the peak value of the current i doubles, the time to reach the i threshold value, (KVr), doubles. If the voltage (Vb–V1) doubles, the charge current at x doubles and the time to reach the KVr level halves, so this part of the delay time is inversely proportional to (Vb–V1) voltage. C12 voltage is clamped above the KVr level to prevent excessive voltage and reset time. Capacitor C13 is held discharged by N FET Q16, as comparator A15 output is high as C12 is charging, going low when the current level i, (KVr) is reached. (For the P FETs, the source is connected to the V+. The other FETs are N FETs, with source towards ground.)

Differential amplifier/current source A14 and P FET Q14 generate a current proportional to V 1, and C13 starts to charge as soon as FET Q16 turns OFF. (Note the connection labeled "y" from Q14 to C13.) The time to reach the KVr level is scaled to represent 1/n of the inductor discharge time into the LED load. For example, if the LED voltage V1 is doubled, the charging current at y doubles, and the time to reach level KVr halves. When C13 reaches the level KVr (representing current (i)), the fast comparator A16 output clocks a shift register that sets the flop-flop U12 (shown) to Un (for the n–1 stages, not shown) to turn on the switching device for the next phase and also starts a new delay by resetting C12. As a small detail, any time lost in resetting C12 can be recovered by resetting C12 to a small positive offset, ideally of magnitude set by the (Vb–V1) current or voltage as generated in the resistor (not labeled) connected to Q15 source. A timing diagram is shown (FIG. 6B) with the next phase being triggered by the sum of C12 and C13 charging times. After n delays, the master initiates a new burst triggered by the end of its cycle as sensed by comparator A17.

The comparator A17 operates in a manner similar to A2, and senses peak current reached in Q12 and resets flip-flop U12 (in the manner previously described in FIG. 2). FIG. 6A is simply an implementation of the Phase Controller. In FIG. 6B, the notation "set U13" indicates the setting of the next stage (not shown).

Due to tolerance build up in the series timing (sequential turning ON and OFF of the switches) of each slave stage, the delay between the start time of the last (nth) slave stage and the start of a new (next) master cycle may be slightly different from the average delay between each slave stage start time, thus increasing the composite current ripple. To avoid requiring high tolerance parts and/or adjustment or selection during test, a simple adaptive circuit may be used to automatically make a fine adjustment to the timing reference (for example, the current sources in FIG. 6A) to minimize the ripple just before the master restarts. This can be done by comparing the timing derived after one additional (nth) delay, to the start time of a new master cycle derived from the current in L11. A latch may be set either high or low on every master cycle depending on which edge is first. This low or high level may be smoothed over several cycles and compared with a mid voltage reference (for example, 2.5V if the latch output is 0/5V) to provide a varying DC error signal to pull the delay timing over a limited range to seek a 50% duty cycle of the latch. The timing would thus continually be adjusted so that the last cumulative delay before a new cycle is coincident with the master start time, minimizing ripple at this moment. In this manner, if at the end of a cycle the next master pulse has a +/– timing offset, the adaptive circuit will compensate for it, if necessary.

Digital Implementation of Control Circuit (Phase Controller)

Figure 7:
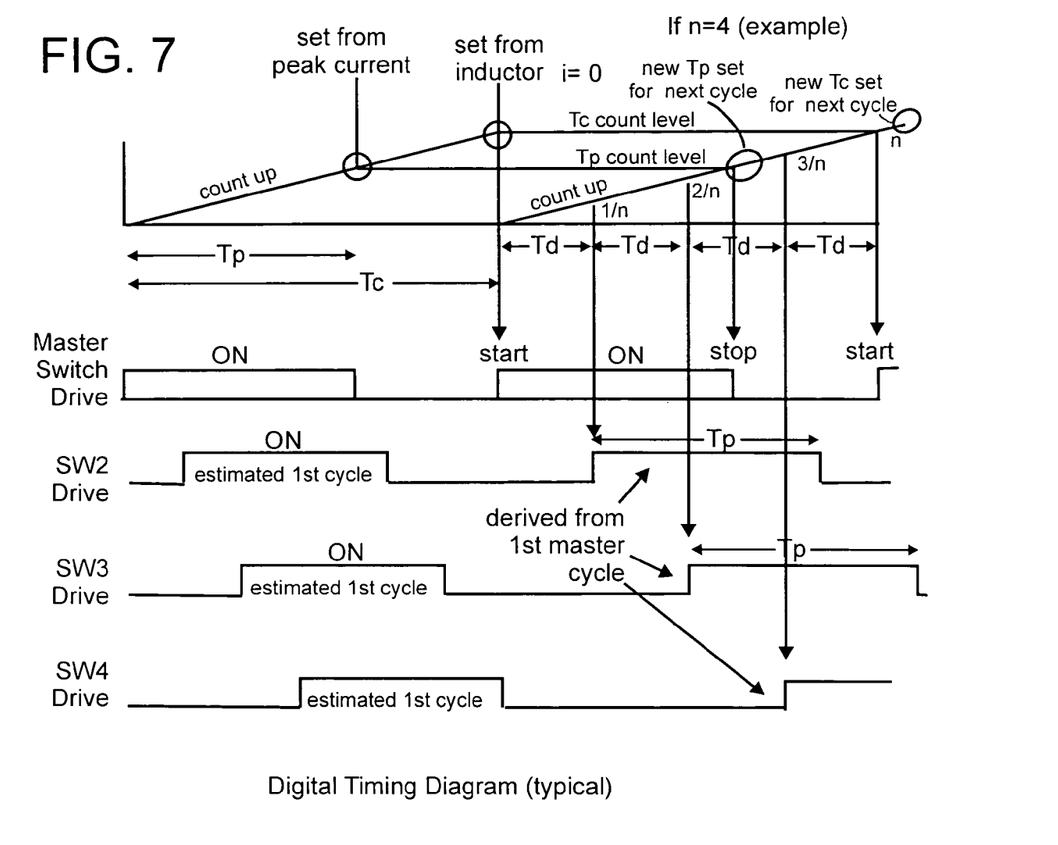
FIG. 7 is a timing diagram for a digital implementation of the control circuit for the polyphase diode driver, according to the invention.

FIG. 7 is a timing diagram for a digital implementation of the Phase Controller, according to the invention.

With respect to FIG. 7, the digital control uses a counter to measure the time Tp until the designated current peak is reached (as defined by the signal from the current demand or error amplifier). A second measurement of time Tc is taken when the current in the master switching stage reaches zero or close to zero as determined by measuring the inductor current or voltage change. This is the cycle time and may be divided by n where n is the number of stages, to yield Td, the phase delay period. A waveform sequence may be set up based on the stored times from the previous cycle of the master switch. The master switch starts a new cycle at time Tc. The second switch starts at Tc plus Td, the third switch starts at Tc+2 Td, the nth at Tc+(n–1) Td. Each switch (preferably) turns off at the present peak current reference value using a fast comparator as previously described or, alternatively, at a time Tp after starting, using a real time digital processor. New values of Tp, Tc and Td are established from each new master switch cycle. In this way, the starting delay times of each ON period of the switches are equally spaced despite changing master cycle times as, for example, when the supply voltage droops. The digital implementation may be programmed into a gate array using well-known functions such as counters, registers, dividers, and digital comparators. The value of Td and Tp for the first master cycle may be estimated default values. A diagrammatic timing diagram is shown in FIG. 7 for n=4. The values of the count up at the instant where the master peak current threshold is reached, Tp, count level, and where the inductor current falls to zero, Tc count level, are stored in a register. The Tc count is divided by n(4) to give stored counts at ¼, ½, and ¾ of Tc. The counter is reset at time Tc (cycle time when the inductor current reaches zero), and starts to count again. Digital comparators give a real time output when the count reaches the stored levels and turn ON the switches for each phase in an equally spaced manner. The ON period may be set from a peak current comparator as described previously (like the master) or by measuring a time equal to Tp using auxiliary counters. New values of Tc and Tp from the second master cycle refresh the count levels for the next group of slave phases, switches 2, 3 and 4.

An alternative digital method would use an A/D converter to measure both the inductor charging voltage (Vb–V1) and the LED voltage (V1), and input the peak current. A processor calculates the appropriate phase delays from the previously discussed formulae and outputs timed signals to the switches.

Other variations of these methods accomplishing essentially the same effect without straying from the essence and spirit of the polyphase driver approach may be apparent to those skilled in the art and are intended to be covered by this disclosure. For example, continuous current flow in the inductors may be used by starting the next cycle at a value greater than zero (i.e., before the current in the inductor of the master stage decays to zero).

It is within the scope of the invention that the phase of the slave stages may be adjusted to minimize the ripple variation in the LED (load) current, using for example a VCO (voltage controlled oscillator) controlling the shift register generating the switch trigger pulses. The VCO frequency would be adjusted within limits by a feedback loop setting a minimum ripple. In other words, the timing of triggering the stages by sensing ripple in the load current to minimize this ripple is controlled.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. Polyphase diode driver for supplying a total current to a load comprising:
    a supply line;
    a plurality (n) of at least two driver stages, each having an output;
    each driver stage comprises a switching device and an inductor connected in series between the switching device and the output of the driver stage;
    means for providing a value of a demanded current to at least one of the driver stages;
    means for turning the switching devices of the driver stages ON and OFF; and
    the outputs of the driver stages are connected to a common drive terminal for supplying the total current to the load.

2. The polyphase diode driver of claim 1, wherein:
    the switching devices are turned ON in sequence with one another, during a master cycle time.

3. The polyphase diode driver of claim 2, wherein:
    the master cycle time is determined by sensing current through the inductor in the master stage.

4. The polyphase diode driver of claim 3, wherein:
    the master cycle time is determined by sensing when current through the inductor in the master stage ramps down to essentially zero.

5. The polyphase diode driver of claim 4, wherein:
    the switching device in the master stage is turned ON at the beginning of the master cycle time; and
    the switching devices in the stages other than the master stage are turned ON periodically during the master cycle time.

6. The polyphase diode driver of claim 5, further comprising:
    wherein:
    the switching device in the master stage is turned OFF when current through the inductor in the master stage reaches the value of the demanded current; and
    the switching devices in the stages other than the master stage are turned OFF after a time which corresponds to a time it took for the value of the demanded current to be reached in the master stage.

7. The polyphase diode driver of claim 5, wherein:
    the switching device in the master stage is turned OFF when current through the inductor in the master stage reaches the value of the demanded current; and
    the switching devices in the stages other than the master stage are turned OFF when the value of the demanded current is reached in the given stage other than the master stage.

8. The polyphase diode driver of claim 1, wherein:
    in each stage, when the switching device is turned ON current through the inductor rises, when the inductor current reaches the value of the demanded current the switch is turned OFF, and after the switch is turned OFF the inductor continues to supply current to the load with a current which ramps down.

9. The polyphase diode driver of claim 1, further comprising:
    in each stage, a rectifying device connected between the inductor and the supply line to allow current to continue to flow in the inductor and be supplied to the load after the switch is turned off.

10. The polyphase diode driver of claim 9, wherein:
    the rectifying device is a diode.

11. The polyphase diode driver of claim 1, wherein:
    the total current comprises a multiple of the value of the value of the demanded current.

12. The polyphase diode driver of claim 1, wherein:
    one of the driver stages is a master stage and the remaining driver stages are slave stages;
    further comprising:
    means for measuring a cycle time of the master stage;
    means for dividing the cycle time by the number (n) of stages;
    means for turning ON the switching device in the slave stages, sequentially, after the switching device in the master stage has been turned on.

13. The polyphase diode driver of claim 12, further comprising:
    means for sensing current in at least the master stage.

14. The polyphase diode driver of claim 1, further comprising:
    a power source connected to the supply line.

15. The polyphase diode driver of claim 14, further comprising:
    a converter connected between the power source and the supply line.

16. The polyphase diode driver of claim 1, further comprising:
    an LED load having one end connected to a supply line and another end connected to the common drive terminal.

17. Method of supplying a controlled current to a load comprising:
    driving the load with at least two (n) stages, one of which is a master stage, the remainder of which are slave stages;
    triggering the stages sequentially during a cycle time; and
    summing output currents of the stages to drive the load.

18. The method of claim 17, further comprising:
    controlling timing of triggering the stages by sensing ripple in load current and triggering the stages to minimize ripple in the current to the load.

19. The method of claim 17, wherein:
    the cycle time is determined by sensing when current through the inductor in the master stage ramps down to essentially zero.

20. The method of claim 17, wherein:
    a switching device in the master stage is turned on at the beginning of the cycle time; and
    switching devices in the stages other than the master stage are turned on periodically during the cycle time.

21. The method of claim 20, wherein:
    the switching device in the master stage is turned OFF when current in the master stage reaches a demanded value; and
    the switching devices in the stages other than the master stage are turned OFF after a time which corresponds to the time it took for the demanded level of current to be reached in the master stage.

22. The method of claim 20, wherein:
the switching device in the master stage is turned OFF when current in the master stage reaches a demanded value; and
the switching devices in the stages other than the master stage are turned OFF when the demanded level of current is reached in the given stage other than the master stage.

23. The method of claim 17, wherein:
in each stage, when a switching device is turned ON current output from the stage ramps up, when the current reaches the demanded value the switch is turned OFF, and after the switch is turned OFF the current output from the stage ramps down.

24. The method of claim 23, wherein:
the summed output currents comprise a multiple of the value of the demanded current.

25. The method of claim 17, further comprising:
measuring a cycle time of the master stage;
dividing the cycle time by the number (n) of stages;
turning on the slave stages, sequentially, after the master stage has been turned on.

26. The method of claim 17, further comprising:
sensing current in at least the master stage.

27. The method of claim 17, wherein:
the load is at least one light emitting diode.

28. The method of claim 17, further comprising:
measuring the current in the load;
comparing the current in the load with an input demand signal representative of a current and, based on the comparison, controlling the triggering of the stages until the current in the load equals the current represented by the input demand signal.

29. Polyphase diode driver for supplying a controlled current to a load comprising:
a supply line for receiving power from a power source;
a return line;
a plurality (n) of at least two driver stages, each driver stage having an output, a first of the driver stages being designated as a master driver stage, the remaining stages being designated subsequent or slave stages;
the outputs of the driver stages are connected to a common drive terminal for driving the load;
a phase controller having an input and a plurality (n) of at least two outputs;
an input line for receiving a signal representative of a demanded value of peak current;
means for determining a cycle of the master driver stage;
wherein each of the driver stages comprises:
a switching device having a switching terminal and two end terminals;
an inductor having two ends; and
a rectifying device having two end terminals;
wherein the master driver stage further comprises:
a current sensing component having two ends;
a flip-flop having a set input, a reset input and an output; and
a comparator having two inputs and an output;
wherein for each driver stage:
a first of the end terminals of the switching device is connected to a first end of the inductor;
the rectifying device is connected between the supply line and the first end terminal of the switching device;
a second end of the inductor is connected to the common drive terminal;
wherein for the master driver stage:
the output of the flip-flop is connected to the switching terminal of the switching device;
a second of the end terminals of the switching device is connected via the current sensing component to the return line, and is also connected to a first input of the comparator;
a second input of the comparator is connected to the demand line; and
the output of the comparator is connected to the reset input of the flip-flop;
a first one of the outputs of the phase controller is connected to the set terminal of the flip-flop in the master stage.

30. The polyphase diode driver of claim 29, wherein each of the slave stages further comprises:
a current sensing component having two ends;
a flip-flop having a set input, a reset input and an output; and
a comparator having two inputs and an output;
wherein for the slave stages:
the output of the flip-flop is connected to the switching terminal of the switching device;
a second of the end terminals of the switching device is connected via the current sensing component to the return line, and is also connected to a first input of the comparator;
a second input of the comparator is connected to the demand line; and
the output of the comparator is connected to the reset input of the flip-flop;
a selected one of the outputs of the phase controller is connected to the set terminal of the flip-flop in the slave stage.

31. The polyphase diode driver of claim 29, wherein:
the current sensing component is selected from the group consisting of resistor, transformer and Hall effect sensor;
the switching device comprises a FET;
the rectifying device is selected from the group consisting of diode and synchronously controlled switching element.

32. The polyphase diode driver of claim 29, further comprising:
a storage capacitor connected between the supply line and the return line.

33. The polyphase diode driver of claim 29, further comprising:
a power source connected between the supply line and the return line.

34. The polyphase diode driver of claim 29, further comprising:
a converter connected between the power source and the supply line.

35. The polyphase diode driver of claim 29, further comprising:
an LED load having one end connected to the supply line and another end connected to the common drive terminal.

* * * * *